United States Patent
Jin et al.

(10) Patent No.: US 8,354,686 B2
(45) Date of Patent: Jan. 15, 2013

(54) LIGHT EMITTING DEVICE ARRAY

(75) Inventors: HongBoem Jin, Seoul (KR); HanCheol Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/107,071

(22) Filed: May 13, 2011

(65) Prior Publication Data

US 2011/0242805 A1     Oct. 6, 2011

(30) Foreign Application Priority Data

May 14, 2010     (KR) ........................ 10-2010-0045534

(51) Int. Cl.
*H01L 33/00*          (2010.01)
(52) U.S. Cl. .......... 257/98; 362/249.02; 257/97; 257/99
(58) Field of Classification Search ............. 362/249.02, 362/800, 612–613; 257/97–99
See application file for complete search history.

(56) References Cited

U.S. PATENT DOCUMENTS

| | | | |
|---|---|---|---|
| 5,278,432 A * | 1/1994 | Ignatius et al. | 257/88 |
| 6,283,612 B1 * | 9/2001 | Hunter | 362/240 |
| 6,942,360 B2 * | 9/2005 | Chou et al. | 362/238 |
| 7,377,669 B2 * | 5/2008 | Farmer et al. | 362/249.01 |
| 7,506,995 B2 * | 3/2009 | Thomas et al. | 362/227 |
| D593,045 S * | 5/2009 | Plonski et al. | D13/180 |

FOREIGN PATENT DOCUMENTS

| | | |
|---|---|---|
| JP | 2009-099497 | 5/2009 |
| KR | 10-2004-0029230 | 4/2004 |
| KR | 10-2008-0013183 | 2/2008 |
| KR | 20-2009-0009952 | 10/2009 |

OTHER PUBLICATIONS

Korean Office Action dated Nov. 22, 2012 for related Korean Application No. 10-2010-0045534.

* cited by examiner

*Primary Examiner* — Anabel Ton
(74) *Attorney, Agent, or Firm* — KED & Associates LLP (57) ABSTRACT

A light emitting device array is provided comprising a printed circuit board on which a plurality of electrode patterns having the same width is formed, a light emitting device package disposed on a predetermined number of electrode patterns and a power supply line disposed on at least one of the remaining electrode pattern except for the predetermined number of electrode patterns.

20 Claims, 7 Drawing Sheets

LIGHT EMITTING DEVICE ARRAY

CROSS-REFERENCE TO RELATED APPLICATION

This application claims the priority benefit of Korean Patent Application No. 10-2010-0045534, filed on May 14, 2010 in the Korean Intellectual Property Office, the disclosure of which is incorporated herein by reference.

BACKGROUND OF THE EMBODIMENT

1. Technical Field

Embodiments are directed to a light emitting device array.

2. Discussion of the Related Art

Light Emitting Diodes (LEDs), as a representative example of light emitting elements, are semiconductor elements functioning to convert electric energy into light and are receiving attention as a next generation light source to replace conventional fluorescent lights and incandescent lights. Such light emitting diodes generate light using semiconductors and therefore, consume only significantly less electricity than incandescent lights, which generate light by heating tungsten, and fluorescent lights which generate light by irradiating a phosphor with ultraviolet light produced by high voltage discharge. In addition, since light emitting diodes generate light using a potential gap of semiconductors, they have a longer lifespan and a faster response time than conventional light sources and are environmentally friendly.

Accordingly, many studies have been conducted into light emitting diodes capable of replacing conventional light sources, and methods to improve the color rendering and light diffusion of a light emitting apparatus using light emitting diodes have been actively studied.

SUMMARY OF THE EMBODIMENT

Embodiments provide a light emitting device array having a simple circuit configuration to enable efficient supply of power to light emitting device packages when a regular number of electrode patterns are disposed on a printed circuit board and a smaller number of light emitting device packages are disposed on some of the electrode patterns.

According to an embodiment, there is provided a light emitting device array comprising a printed circuit board on which a plurality of electrode patterns having the same width is formed, a light emitting device package disposed on a predetermined number of electrode patterns and a power supply line disposed on at least one of the remaining electrode pattern except for the predetermined number of electrode patterns.

According to an embodiment, there is provided a light emitting device array comprising a printed circuit board on which a plurality of electrode patterns having the same width is formed, a light emitting device package disposed on a predetermined number of electrode patterns and a power supply line disposed on at least one of the remaining electrode pattern except for the predetermined number of electrode patterns, wherein the power supply lines include a first power supply line disposed on a first electrode pattern of the remaining electrode patterns, and a second power supply line disposed on second and third successive electrode patterns of the remaining electrode patterns.

According to an embodiment, there is provided a lighting system comprising a light emitting device array including a printed circuit board on which a plurality of electrode patterns having the same width is formed, a light emitting device package disposed on a predetermined number of electrode patterns and a power supply line disposed on at least one of the remaining electrode pattern except for the predetermined number of electrode patterns, and a lighting body in which the light emitting device array is received.

DETAILED DESCRIPTION OF THE EXEMPLARY EMBODIMENTS

Hereinafter, exemplary embodiments will be described in detail with reference to the accompanying drawings, wherein the same reference numerals are used to denote the same or substantially the same elements throughout the specification and the drawings. In the drawings, it will be understood that when a layer (or film, region, pattern, or substrate) is referred to as being 'on' or 'under' another layer (or film, region, pattern, or substrate), it can be directly on or under the other layer (or film, region, pattern, or substrate), or intervening layers may also be present.

In the drawings, the dimensions, such as sizes or thicknesses, of layers or films are exaggerated, omitted, or schematically shown for clarity of illustration. Accordingly, the sizes of the elements in the drawings do not thoroughly reflect real sizes of elements.

Angles and directions described herein are based on those shown in the drawings. Reference points of angles and locations of LED array structures, which are not clearly described herein, are based on those shown in the drawings.

Figure 1:
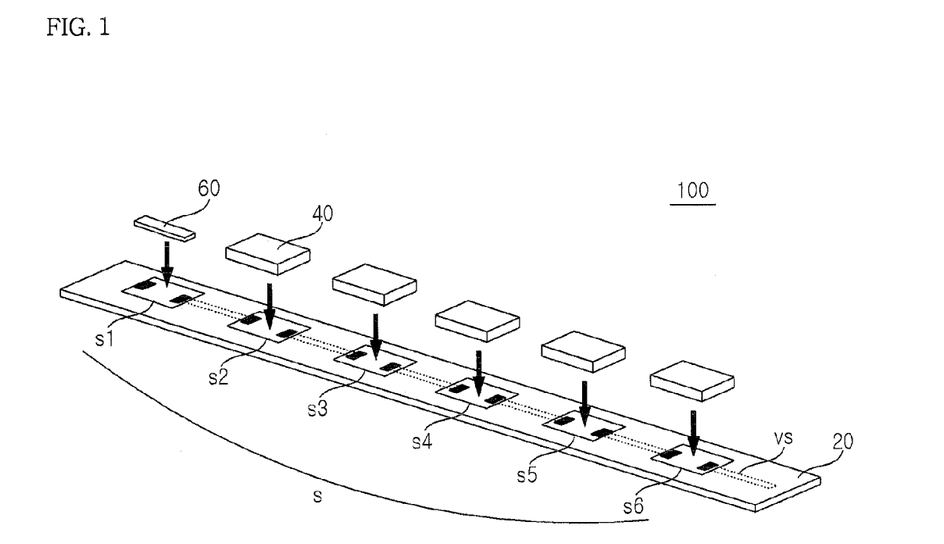
FIG. 1 is a perspective view illustrating a light emitting device array in accordance with a first embodiment.

FIG. 1 is a perspective view illustrating a light emitting device array in accordance with a first embodiment.

Referring to FIG. 1, the light emitting device array 100 includes a printed circuit board 20 in which a first number of electrode patterns s having the same width and a current line vs connecting adjacent electrode patterns s to each other are provided to form a series circuit pattern, a second number of light emitting device packages 40 disposed on some of the electrode patterns s, and a third number of power supply lines disposed on the remaining electrode patterns s, the third number being equal to a difference between the first number and the second number.

Here, a fixed number, i.e. the first number of the electrode patterns s having the same size are disposed on the printed circuit board 20, to form a series circuit pattern.

In the case where the first number of electrode patterns s are provided on the printed circuit board 20, it will be appreciated that a series circuit is not formed when the second number of light emitting device packages 40 (here, the second number is less than the first number) are disposed on the electrode patterns s.

Therefore, the third number of power supply lines 60 (here, the third number is equal to a difference between the first number and the second number) are disposed on the electrode patterns s on which the light emitting device packages 40 are not disposed.

That is, it will be appreciated that the power supply lines 60 connect neighboring electrode patterns s to each other to form a series circuit, thereby serving to supply power to the second number of light emitting device packages 40.

In this case, the power supply lines 60 preferably have a resistance value of 0 ohms to 5 ohms. If the resistance value is excessively high, voltage drop may cause power to be irregularly supplied to the second number of light emitting device packages 40, which results in deterioration of light efficiency.

In the embodiment, as illustrated in FIG. 1, the printed circuit board 20 may be provided with six electrode patterns s to form a series circuit pattern, and five light emitting device packages 40 and one power supply line 60 are disposed respectively on the six electrode patterns s.

FIG. 1 is provided by way of example, and the mounting positions and number of the power supply lines 60 may be changed rather than being limited to the illustration of FIG. 1.

For example, although FIG. 1 illustrates the single power supply line 60 as being disposed on the electrode pattern s, two or more power supply lines 60 may be disposed.

As illustrated in FIG. 1, the power supply line 60 is disposed on a first electrode pattern s1 of the electrode patterns s, and the light emitting device packages 40 are disposed on the second to sixth electrode patterns s2 to s6. Thereby, a series circuit is formed even if power is supplied to the first electrode pattern s1 or the sixth electrode pattern s6.

The light emitting device packages 40 may include any one of red (R), green (G), blue (B) and white (W) light emitting device packages, or may include at least two of red, green, blue and white light emitting device packages. Also, the light emitting device packages 40 may be regularly disposed on the first number of electrode patterns s.

In addition, the light emitting device packages 40 may have the same length and width (size) on a per color basis.

Figure 2:
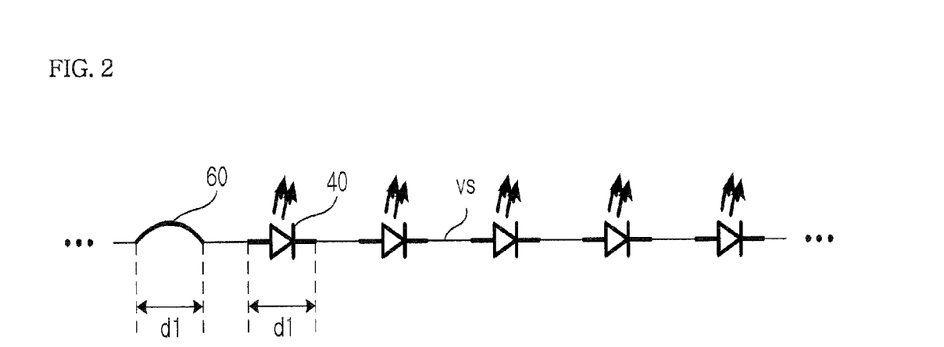
FIGS. 2 to 4 are schematic circuit diagrams respectively illustrating first to third embodiments with respect to a circuit configuration of the light emitting device array illustrated in FIG. 1.
Figure 3:
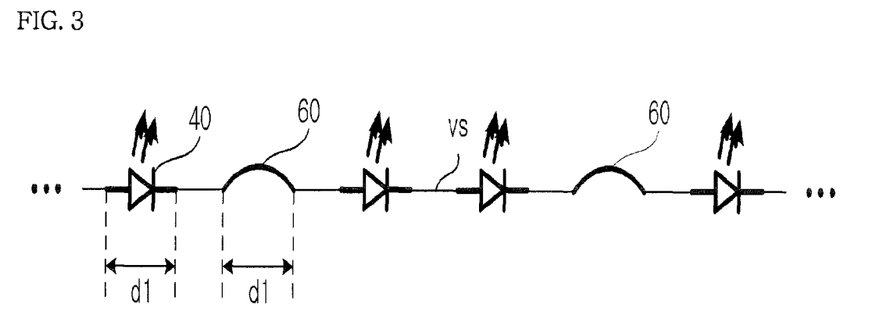
Figure 4:
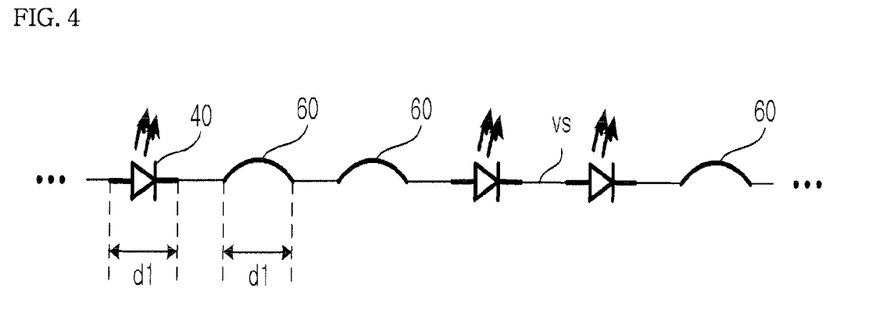

FIGS. 2 to 4 are schematic circuit diagrams respectively illustrating first to third embodiments with respect to a circuit configuration of the light emitting device array 100 illustrated in FIG. 1.

Referring to FIG. 2, in the light emitting device array 100, the power supply line 60 is disposed on the first electrode pattern s1 of the electrode patterns s, and the light emitting device packages 40 are disposed on the second to sixth electrode patterns s2 to s6.

As illustrated in FIG. 2, power is supplied to one end of the power supply line 60 disposed on the first electrode pattern s1 and subsequently, is supplied to the light emitting device package 40 disposed on the second electrode pattern s2.

In this case, although the electrode patterns s, the light emitting device packages 40 and the power supply line 60 may have the same length d1, a mounting length of the power supply line 60 may be greater than the length d1 of the corresponding electrode pattern s.

FIGS. 3 and 4 illustrate the above description of FIG. 2 in brief or with partial omission thereof.

Referring to FIG. 3, the light emitting device array 100 may include a single power supply line 60 disposed between adjacent light emitting device packages 40.

Here, the position of the power supply line 60 may not be limited to between any specific adjacent light emitting device packages 40. Specifically, providing the power supply line 60 between adjacent light emitting device packages 40 may be applied when light efficiency can be maintained even using a reduced number of light emitting device packages 40 because the light emitting device packages 40 have enhanced light efficiency, or be applied to places where low light efficiency is sufficient.

Referring to FIG. 4, the light emitting device array 100 may include at least two power supply lines 60 successively disposed between adjacent light emitting device packages 40, and the at least two power supply lines 60 may have the same length d1.

Although it seems that FIGS. 3 and 4 exhibit the same mounting method, the mounting of the power supply lines 60 may be differentiated based on a difference between the first number of the electrode patterns s and the second number of the light emitting device packages 40.

Although FIGS. 2 to 4 illustrate the electrode patterns s as having the same length d1, the light emitting device packages 40 may have different lengths on a per color basis. Therefore, if it is assumed that at least two power supply lines, i.e. first and second power supply lines are disposed and the first power supply line has the same length as the length d1 of the electrode patterns s, it is preferable that the length of the second power supply line be 1.1 times to 2 times the length d1 of the first power supply line.

In other words, light efficiency of the light emitting device array 100 may be deteriorated if the length of the second power supply line is equal to or less than the length d1 of the first power supply line, or is greater than 2 times the length d1 of the first power supply line.

Figure 5:
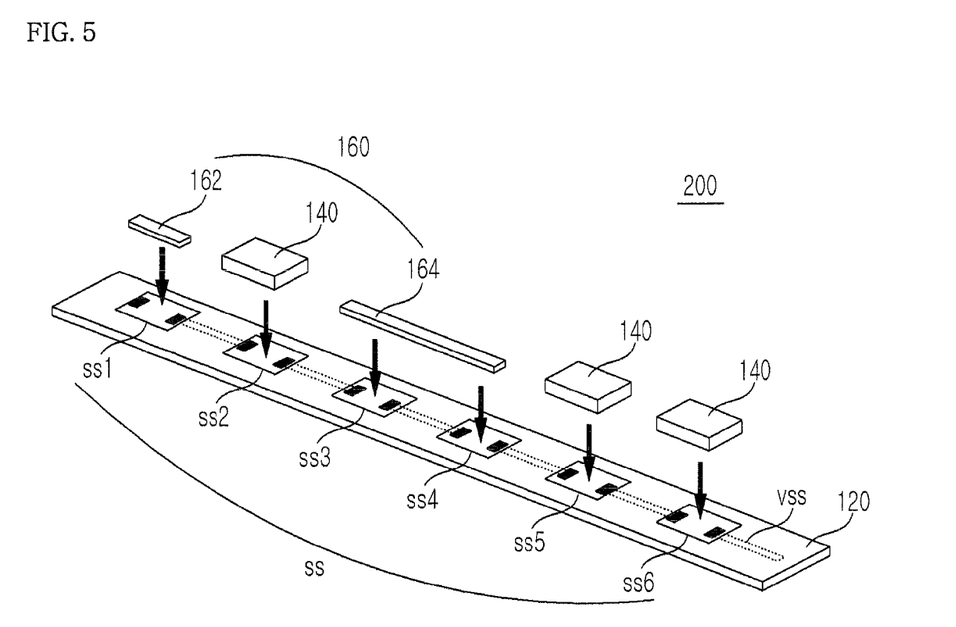
FIG. 5 is a perspective view illustrating a light emitting device array in accordance with a second embodiment.

FIG. 5 is a perspective view illustrating a light emitting device array in accordance with a second embodiment.

Referring to FIG. 5, the light emitting device array 200 includes a printed circuit board 120 in which a first number of electrode patterns ss and a current line vss connecting adjacent electrode patterns ss to each other are provided to form a series circuit pattern, a second number of light emitting device packages 140 disposed on some of the electrode patterns ss, and a third number of power supply lines 160 disposed on others of the electrode patterns ss, the third number being less than a difference between the first number and the second number.

Here, a fixed number, i.e. the first number of the electrode patterns ss are disposed on the printed circuit board 120 to form a series circuit pattern, and the electrode patterns ss have a fixed regular size.

In the case where the first number of electrode patterns ss are provided on the printed circuit board 120, it will be appreciated that a series circuit is not formed when the second number of light emitting device packages 140 (here, the second number is less than the first number) are disposed on the electrode patterns ss.

Therefore, the third number of power supply lines 160 (here, the third number is less than a difference between the first number and the second number) are disposed on the electrode patterns ss on which the light emitting device packages 140 are not disposed.

More specifically, the power supply lines 160 may include a first power supply line 162 disposed on at least one electrode pattern ss of the first number of electrode patterns ss, and a second power supply line 164 disposed on at least two adjacent electrode patterns ss of the first number of electrode patterns ss.

Here, it will be appreciated that the first and second power supply lines 162 and 164 connect neighboring electrode patterns ss to each other to form a series circuit, thereby serving to supply power to the second number of light emitting device packages 140.

In this case, at least one of the first and second power supply lines 162 and 164 preferably has a resistance value of 0 ohms to 5 ohms. If the resistance value is excessively high, voltage drop may cause power to be irregularly supplied to the second number of light emitting device packages 140, which results in deterioration of light efficiency.

In the embodiment, as illustrated in FIG. 5, the printed circuit board 120 may be provided with six electrode patterns ss to form a series circuit pattern, and three light emitting device packages 140 and two power supply lines 60 are disposed on the six electrode patterns ss.

FIG. 5 is provided by way of example, and the mounting positions and number of the power supply lines 160 may be changed rather than being limited to the illustration of FIG. 5.

As illustrated in FIG. 5, the power supply lines 160 include the first power supply line 162 disposed on the first electrode pattern ss1 of the electrode patterns ss and the second power supply line 164 disposed on the third and fourth electrode patterns ss3 and ss4 of the electrode patterns ss, and the light emitting device packages 140 are disposed on the second, fifth and sixth electrode patterns ss2, ss5 and ss6 of the electrode patterns ss.

In this case, the light emitting device array 200 forms a series circuit even if power is supplied to the first electrode pattern ss1 or the sixth electrode pattern ss6.

The light emitting device packages 140 may include any one of red (R), green (G), blue (B) and white (W) light emitting device packages, or may include at least two of red, green, blue and white light emitting device packages. Also, the light emitting device packages 140 may be regularly disposed on the first number of electrode patterns ss.

In addition, the light emitting device packages 140 may have the same length (size) or different lengths on a per color basis.

Figure 6:
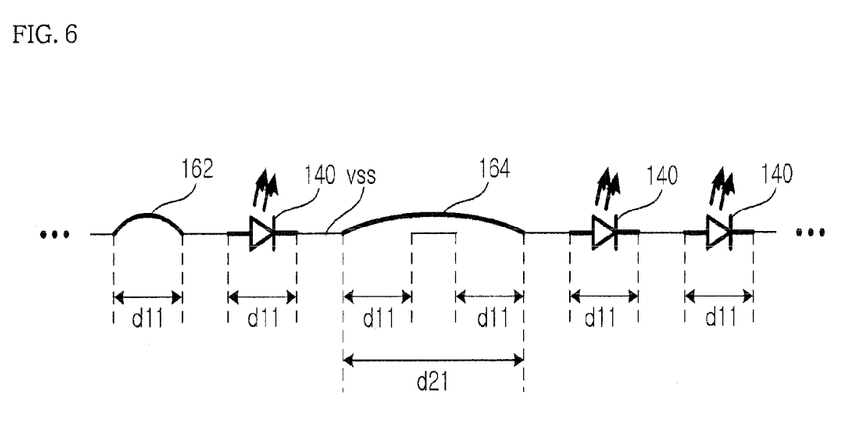
FIG. 6 is a schematic circuit diagram illustrating a first embodiment with respect to a circuit configuration of the light emitting device array illustrated in FIG. 5.

FIG. 6 is a schematic circuit diagram illustrating a first embodiment with respect to a circuit configuration of the light emitting device array 200 illustrated in FIG. 5.

Referring to FIG. 6, in the light emitting device array 200, the first power supply line 162 is disposed on the first electrode pattern ss1, the second power supply line 164 is disposed on the third and fourth electrode patterns ss3 and ss4, and the light emitting device packages 140 are disposed on the second, fifth and sixth electrode patterns ss2, ss5 and ss6.

The first power supply line 162 and the first electrode pattern ss1 may have the same length d11, or the length of the first power supply line 162 may be greater than the length of the first electrode pattern ss1.

Here, the first to sixth electrodes patterns ss1 to ss6 may have the same length, or at least one of the electrode patterns ss may have a different length from the remaining electrode pattern ss.

This is because the lengths of the first to sixth electrode patterns ss1 to ss6 are changed based on the lengths of the light emitting device packages 140.

The second power supply line 164 has a length d21 equal to the total of lengths of the third and fourth electrode patterns ss3 and ss4 such that the second power supply line 164 is connected to one side of the third electrode pattern ss3 and an opposite side of the fourth electrode pattern ss4. That is, if the light emitting devices 140 are not disposed on the adjacent third and fourth electrode patterns ss3 and ss4, the single power supply line may serve to connect the two electrode patterns ss3 and ss4 to each other.

Here, the length d21 of the second power supply line 164 is preferably 2 times to 5 times the length d11 of the first power supply line 162. Infinitely extending the length of the second power supply line 164 is impossible and light efficiency of the light emitting device array 200 may be deteriorated if the length d21 of the second power supply line 164 exceeds 5 times the length d11 of the first power supply line 162.

Figure 7:
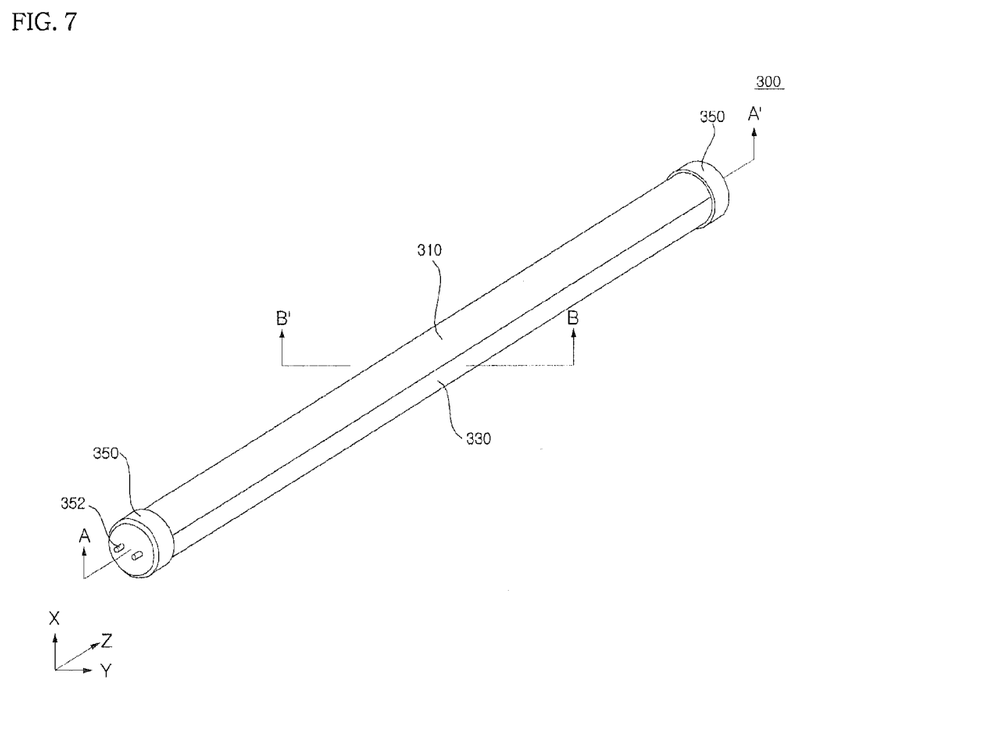
FIG. 7 is a perspective view illustrating a lighting apparatus including the light emitting device array illustrated in FIG. 1 or FIG. 5.
Figure 8:
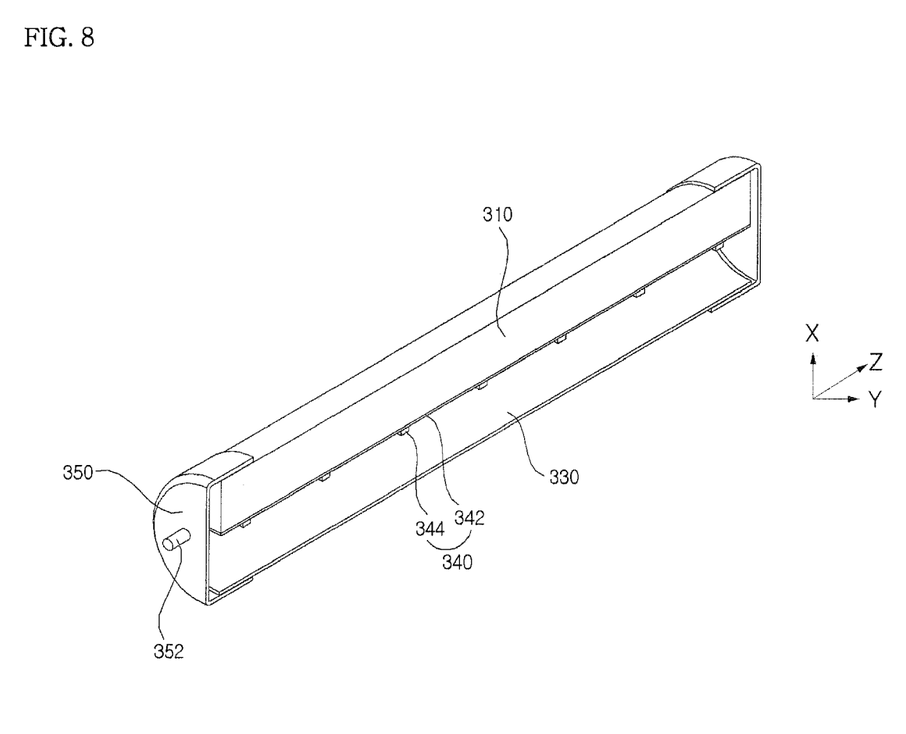
FIG. 8 is a sectional view taken along the line A-A' of the lighting apparatus illustrated in FIG. 7.

FIG. 7 is a perspective view illustrating a lighting apparatus including the light emitting device array illustrated in FIG. 1 or FIG. 5, and FIG. 8 is a sectional view taken along the line A-A' of the lighting apparatus illustrated in FIG. 7.

More particularly, FIG. 8 is a sectional view taken the plane in a longitudinal direction Z and a height direction X and illustrating the lighting apparatus 300 of FIG. 7 viewed in a horizontal direction Y.

Referring to FIGS. 7 and 8, the lighting apparatus 300 includes a lighting body 310, a cover 300 fastened to the lighting body 310, and end caps 350 fitted to both ends of the lighting body 310.

A light emitting device array 340 is coupled to a lower surface of the lighting body 310. The lighting body 310 may be made of a metallic material having good thermal conductivity and heat dissipation properties, in order to dissipate heat generated by light emitting device packages 344 to the outside through an upper surface of the lighting body 310.

The lighting apparatus 300 employs the light emitting device array illustrated in FIG. 1 or FIG. 5.

The light emitting device packages 344 of multiple colors may be arranged in multiple rows on a printed circuit board 342, and may be spaced apart from one another by a constant distance or different distances as necessary, to enable brightness control. The printed circuit board 342 may be a metal board for efficient heat dissipation.

Referring to FIG. 8, since the entire bottom surface of the printed circuit board 342 is closely affixed to the lighting body 310, heat generated by the light emitting device packages 344 can be more effectively conducted to the lighting body 310.

The cover 330 may have a circular shape to surround the lower surface of the lighting body 310, but not limited thereto.

The cover 330 serves to protect the light emitting device array 340 from exterior impurities. The cover 330 may contain light diffusion particles to prevent blinding due to light emitted from the light emitting device packages 344 and assure uniform discharge of light to the outside. In addition, a prismatic pattern may be formed on at least one of inner and outer surfaces of the cover 330.

In consideration of the fact that the light emitted from the light emitting device packages 344 is directed to the outside through the cover 330, it is necessary for the cover 330 to have good light transmittance and sufficient heat resistance to withstand heat generated by the light emitting device packages 344. Preferably, the cover 330 is made of a material including polyethylene terephthalate (PET), polycarbonate (PC), or a polymethyl methacrylate (PMMA).

The end caps 350 may be located at both ends of the lighting body 310 and may serve to hermetically seal a power device (not shown). Each of the end caps 350 is provided with a power pin 352, allowing the lighting apparatus 300 in accordance with the present embodiment to be directly connected to a conventional fluorescent light socket.

Figure 9:
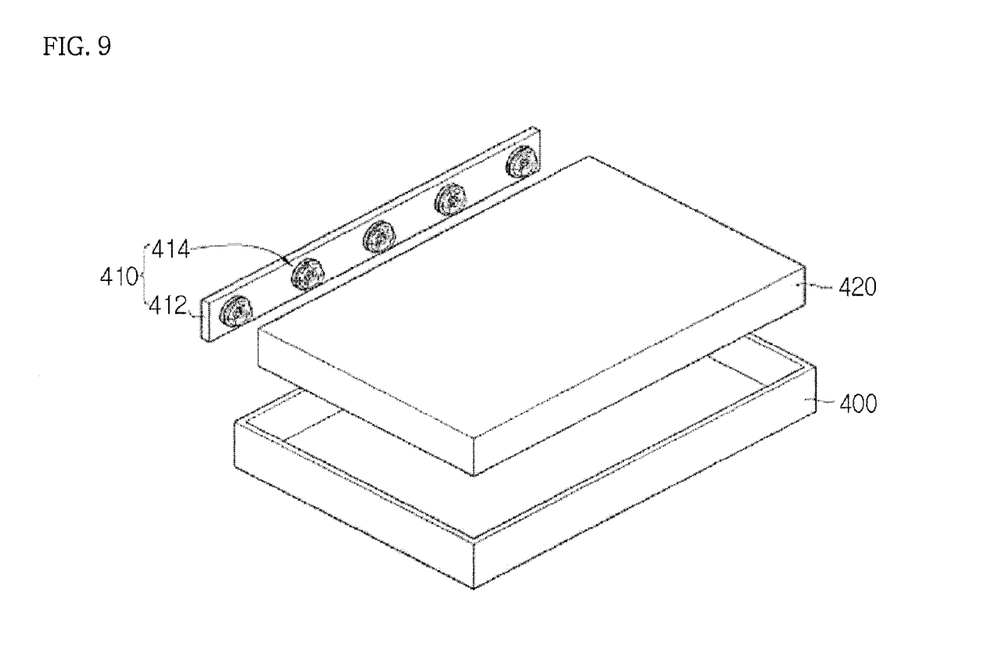
FIG. 9 is a perspective view illustrating a first embodiment of a backlight unit including the light emitting device array.

FIG. 9 is a perspective view illustrating a first embodiment of a backlight unit including the light emitting device array in accordance with the above described embodiment.

FIG. 9 illustrates an edge type backlight unit. Referring to FIG. 9, the backlight unit includes a lower receiving member 400, a light emitting device module 410 to output light, a light guide plate 420 arranged adjacent to the light emitting device module 410, and a plurality of optical sheets (not shown). The plurality of optical sheets (not shown) may be located on the light guide plate 420. Hereinafter, a detailed description of the optical sheets (not shown) will be omitted because it is identical to that of a plurality of optical sheets 530 which will be illustrated and described in relation to FIG. 10.

The light emitting device module 410 may define an array of a plurality of light emitting device packages 414 disposed on a printed circuit board 412. The printed circuit board 412 may be a Metal Core Printed Circuit Board (MCPCB), or may be a Flame Retardant composition 4 (FR-4) PCB. In addition, the printed circuit board 412 may have a rectangular plate shape, or various other shapes depending on the configuration of a backlight assembly.

The light guide plate 420 converts the light emitted from the light emitting device package 414 into planar light to thereby direct the light to a liquid crystal display panel (not shown). A plurality of optical films (not shown), which serve to realize uniform brightness distribution and enhanced vertical incidence of light directed from the light guide plate 420, and a reflecting sheet (not shown), which reflects light having passed through a rear surface of the light guide plate 420 toward the light guide plate 420, may be located at the rear surface of the light guide plate 420.

Figure 10:
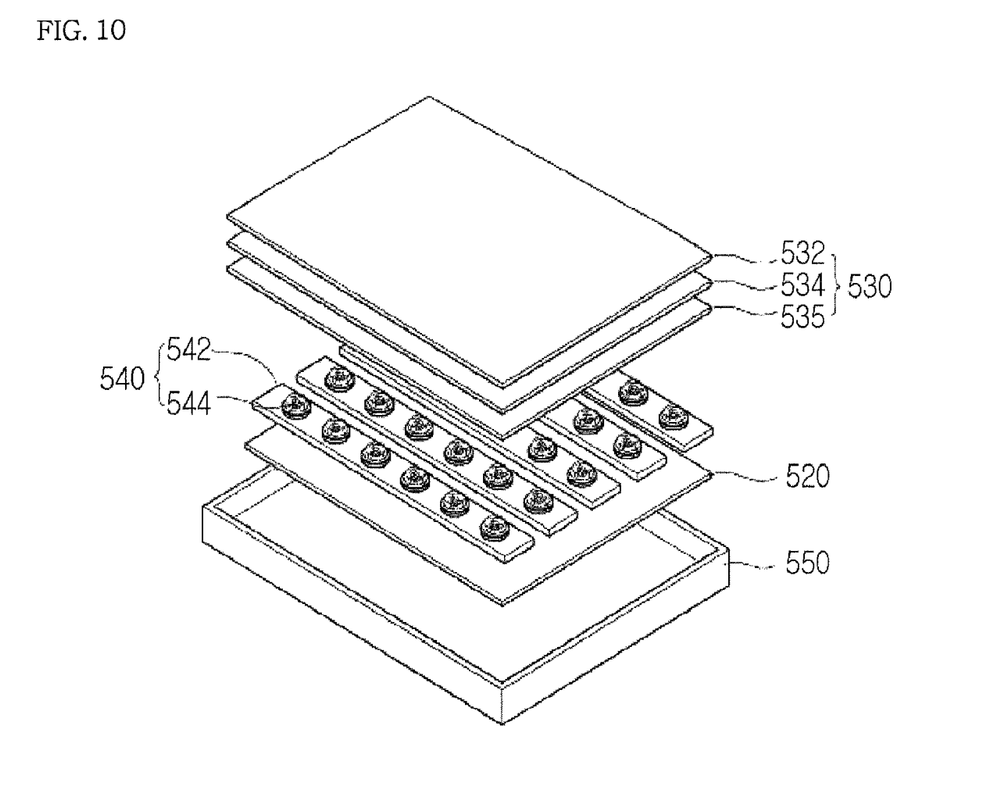
FIG. 10 is a perspective view illustrating a second embodiment of a backlight unit including the light emitting device array.

FIG. 10 is a perspective view illustrating a second embodiment of a backlight unit including the light emitting device array in accordance with the above described embodiment.

FIG. 10 illustrates a vertical type backlight unit. Referring to FIG. 10, the backlight unit may include a lower receiving member 550, a reflecting plate 520, a plurality of light emitting device modules 540, and a plurality of optical sheets 530.

In this case, each of the light emitting device modules 540 may include a plurality of light emitting device packages 544, and a printed circuit board 542 on which the plurality of light emitting device packages 544 is disposed to define an array.

Each of the light emitting device packages 544 may be provided at a bottom surface thereof with a plurality of bosses, which may improve color mixing effects of red light, green light and blue light.

The reflecting plate 520 may be made of a high reflectivity material to reduce light loss. The optical sheets 530 may include at least one of a brightness enhancing sheet 532, a prismatic sheet 534, and a diffusive sheet 535.

The diffusive sheet 535 may serve to diffuse light emitted from the light emitting device packages 544 to provide the light with uniform brightness distribution over a wide range while directing the light toward a liquid crystal display panel (not shown). The prismatic sheet 534 serves to vertically direct light obliquely incident thereon. Specifically, to vertically direct the light having passed through the diffusive sheet 535, at least one prismatic sheet 534 may be disposed below the liquid crystal display panel (not shown). The brightness enhancing sheet 532 serves to transmit light parallel to a transmission axis thereof while reflecting light perpendicular to the transmission axis.

It will be appreciated that the configuration of the edge type backlight unit illustrated and described in FIG. 9 and the configuration of the vertical type backlight unit illustrated and described in FIG. 10 may be combined as occasion demands.

Here, the lighting apparatus 300 and the backlight unit may be included in a lighting system, and other lighting-oriented apparatuses including the above described light emitting device array may be included in the lighting system.

As is apparent from the above description, in accordance with a first embodiment of the present invention, when a second number of light emitting device packages are disposed on a first number of electrode patterns forming a series circuit pattern (here, the second number is less than the first number), to complete the series circuit pattern, a third number of power supply lines (here, the third number is equal to a difference between the first number and the second number) may be disposed, whereby efficient supply of power to the light emitting device packages can be accomplished.

Further, according to an embodiment, at least one light emitting device package may be located between first and second power supply lines having the same length. That is, the arrangement of the power supply lines and the light emitting device packages can be freely changed based on use environments and conditions.

According to a second embodiment of the present invention, under the assumption that the first number of electrode patterns forming a series circuit pattern is provided with the second number of light emitting device packages (here, the second number is less than the first number), the first power supply line may be disposed on at least one of the first number of electrode patterns and the second power supply line may be disposed on at least two successively arranged ones of the first number of electrode patterns, which results in a simple series circuit pattern configuration.

The embodiment has been explained above with reference to characteristic. It will be evident to those skilled in the art that various modifications may be made thereto without departing from the broader spirit and scope of the embodiment. Further, although the embodiment has been described in the context its implementation in particular environments and for particular applications, those skilled in the art will recognize that the present embodiments usefulness is not limited thereto and that the embodiment can be beneficially utilized in any number of environments and implementations. The foregoing description and drawings are, accordingly, to be regarded in an illustrative rather than a restrictive sense.

What is claimed is:

1. A light emitting device array comprising:
   a printed circuit board on which a plurality of electrode patterns having substantially a same width are formed;
   a plurality of light emitting device packages, each comprising at least one light emitting diode, electrically coupled to a predetermined number of electrode patterns, wherein the predetermined number of electrode patterns is less than the plurality of electrode patterns; and
   at least one power supply line electrically coupled to at least one of the remaining electrode patterns except for the predetermined number of electrode patterns, wherein the plurality of electrode patterns are connected in series and wherein the at least one power supply line is coupled in series with the plurality of electrode patterns and overlaps at least one of the remaining electrode patterns except for the predetermined number of electrode patterns.

2. The light emitting device array of claim 1, wherein the plurality of light emitting device packages are disposed to overlap the predetermined number of electrode patterns.

3. The light emitting device array of claim 1, wherein the at least one power supply line has a resistance value of 0 ohms to 5 ohms.

4. The light emitting device array of claim 1, wherein:
the at least one power supply line includes first and second power supply lines; and
a length of the first power supply line is at least substantially equal to or greater than a length of the second power supply line.

5. The light emitting device array of claim 4, wherein the length of the first power supply line is 1.1 times to 2 times the length of the second power supply line.

6. The light emitting device array of claim 4, wherein at least one of the light emitting device packages is provided between the first and second power supply lines.

7. The light emitting device array of claim 4, wherein the first and second power supply lines are disposed in succession.

8. The light emitting device array of claim 1, wherein the light emitting device packages are selected from the group consisting of red (R), green (G), blue (B) and white (w) light emitting device packages.

9. The light emitting device array of claim 1, wherein the light emitting device packages includes at least two selected from the group consisting of red (R), green (G), blue (B) and white (W) light emitting device packages disposed on the predetermined number of electrode patterns.

10. A light emitting device array comprising:
a printed circuit board on which a plurality of electrode patterns having substantially a same width are formed;
a plurality of light emitting device packages electrically coupled to a predetermined number of electrode patterns, wherein the predetermined number of electrode patterns is less than the plurality of electrode patterns; and
at least one power supply line electrically coupled to at least one of the remaining electrode patterns except for the predetermined number of electrode patterns,
wherein the at least one power supply line includes:
a first power supply line electrically coupled to a first electrode pattern of the remaining electrode patterns, and
a second power supply line electrically coupled to second and third successive electrode patterns of the remaining electrode patterns, wherein the plurality of electrode patterns are connected in series and wherein the at least one power supply line is coupled in series with the plurality of electrode patterns and overlaps at least one of the remaining electrode patterns except for the predetermined number of electrode patterns.

11. The light emitting device array according to claim 10, wherein a length of the second power supply line is 2 times to 5 times a length of the first power supply line.

12. The light emitting device array according to claim 10, wherein the first and second power supply lines are not disposed in succession.

13. A lighting system comprising:
a light emitting device array including a printed circuit board on which a plurality of electrode patterns having substantially a same width is formed,
a plurality of light emitting device packages, each comprising at least one light emitting diode, electrically coupled to a predetermined number of electrode patterns, wherein the predetermined number of electrode patterns is less than the plurality of electrode patterns; and
at least one power supply line electrically coupled to at least one of the remaining electrode patterns except for the predetermined number of electrode patterns; and
a lighting body coupled to the light emitting device array and including one or more terminals, wherein the plurality of electrode patterns are connected in series, wherein at least one power supply line is coupled in series with the plurality of electrode patterns and overlaps at least one of the remaining electrode patterns except for the predetermined number of electrode patterns, and wherein the terminal transfers power to the light emitting device array for illumination.

14. The light emitting device array according to claim 1, wherein:
the printed circuit board includes a plurality of current lines electrically connecting respective pairs of the predetermined number of electrode patterns,
each pair of the predetermined number of electrode patterns includes adjacent electrode patterns, and
the at least one power supply line is different from the current lines.

15. The light emitting device array according to claim 1, wherein the at least one power supply line is between two of the plurality of light emitting device packages.

16. A light emitting device array, comprising:
a printed circuit board on which a plurality of electrode patterns are formed having substantially a same width;
a plurality of light emitting device packages, each comprising at least one light emitting diode, electrically coupled to a predetermined number of electrode patterns; and
at least one power supply line electrically coupled to at least one of the remaining electrode patterns except for the predetermined number of electrode patterns, wherein the plurality of electrode patterns are connected in series, wherein the at least one power supply line is coupled in series with the plurality of electrode patterns, and wherein:
the plurality of electrode patterns is a first number,
the at least one power supply line corresponds to a second number, and
the predetermined number of electrode patterns equals a difference between the first number and the second number.

17. The light emitting device array of claim 10, wherein the plurality of light emitting device packages are disposed to overlap the predetermined number of electrode patterns.

18. The light emitting device array of claim 10, wherein the at least one power supply line is between two of the plurality of light emitting device packages.

19. The light system of claim 13, wherein the plurality of light emitting device packages are disposed to overlap the predetermined number of electrode patterns.

20. The light system of claim 13, wherein the at least one power supply line is between two of the plurality of light emitting device packages.

* * * * *